United States Patent [19]
Saarnimo et al.

[11] Patent Number: 5,291,150
[45] Date of Patent: Mar. 1, 1994

[54] CONTROL CIRCUITRY FOR AN RF SIGNAL AMPLIFIER

[75] Inventors: Timo Saarnimo; Mika Niemiö, both of Salo, Finland

[73] Assignee: Nokia Mobile Phones Ltd., Salo, Finland

[21] Appl. No.: 918,546

[22] Filed: Jul. 22, 1992

[30] Foreign Application Priority Data

Jul. 23, 1991 [FI] Finland ................................ 913529

[51] Int. Cl.$^5$ ............................... H03G 3/30
[52] U.S. Cl. .................................... 330/279; 328/26; 330/140
[58] Field of Search ............ 307/351; 328/26; 329/367; 330/129, 140, 279; 455/116, 126, 239.1, 240.1, 252.1

[56] References Cited

U.S. PATENT DOCUMENTS

| | | | |
|---|---|---|---|
| 4,158,180 | 6/1979 | Challen | 330/298 |
| 4,523,155 | 6/1985 | Walczak et al. | 330/279 |
| 4,602,218 | 7/1986 | Vilmur et al. | 330/279 |
| 4,937,842 | 6/1990 | Howell | 375/98 |

FOREIGN PATENT DOCUMENTS

| | | | |
|---|---|---|---|
| 913529 | 3/1992 | Finland . | |
| 79722 | 5/1982 | Japan | 330/129 |

*Primary Examiner*—James B. Mullins
*Attorney, Agent, or Firm*—Perman & Green

[57] ABSTRACT

Control circuitry for maintaining the magnitude of an RF signal from an RF signal amplifier at a predetermined level includes a detector which is supplied with a signal indicative of the power level of the output from the amplifier and outputs a signal which is dependant upon the input signal. A detector (100) is provided with a negative feedback loop (200) which supplies a biasing voltage Vb to the input of the detector, whereby the biasing voltage Vb decreases if the magnitude of the signal (P) input and hence the output signal (Vr), increases, thus serving to decrease the output voltage (Vr), and vice versa. This has the advantage of increasing the dynamic range of the detector.

4 Claims, 3 Drawing Sheets

CONTROL CIRCUITRY FOR AN RF SIGNAL AMPLIFIER

The invention relates to control circuitry for maintaining the magnitude of a radio frequency signal, from a radio frequency signal amplifier, at a predetermined level, the control circuitry comprising a detector having an input for receiving a signal indicative of the power level of the output from the amplifier, and an output for delivering an output signal dependant upon the input signal wherein the output signal is used to control the gain of the amplifier.

Detectors in such circuitry are subject to contradictory requirements. The magnitude of the input signal of the detector must not exceed the operating voltage of the device, which limits the maximum level of the input signal of the detector. On the other hand, a high frequency input signal should always be kept on a sufficient level to prevent the temperature dependency of the detector from causing interference. Thus, there will be a minimum and a maximum limit for the detector, i.e. the dynamic range of the detector will be confined to a given level.

In terms of circuit technique, it is advantageous to enlarge the dynamic range of the detector.

In U.S. Pat. No. 4,523,155 there is disclosed a detector having an enlarged dynamic range, in which the temperature variations of the detector are compensated for. FIGS. 1a and 1b illustrate, schematically, the disclosure of U.S. Pat. No. 4,523,155. FIG. 1a illustrates the disclosure in block diagram form and 1b is a circuit diagram corresponding to the block diagram of FIG. 1a. U.S. Pat. No. 4,523,155 discloses temperature compensated automatic output control (AOC) circuitry for a radio frequency power amplifier 300. The power amplifier 300, amplifies an RF signal (RF) before it is supplied to an antenna 500 for transmission. The power amplifier 300 operates at one of a number of preselected power levels and the AOC circuitry maintains the output power level, over a range of frequencies and temperatures, at the selected power level. The AOC circuitry includes control circuitry 400 which uses input AOC signals to select a number of different power levels ranging over a dynamic range of 28 dB. The output from the control circuitry 400 is used to vary the power output of the power amplifier 300 i.e. to control the gain thereof. The AOC circuitry also includes a detector 100 which is used to detect the magnitude of the output power of the signal, P, output from the amplifier 300 and to produce an output signal Vr which is dependant upon the magnitude i.e. power, of the signal P from the power amplifier 300. The detector 100 is provided with temperature compensation circuitry 101 to compensate for variations in the detector due to temperature. This is achieved by supplying a compensation bias voltage VB through a resistor R1 as a biasing voltage Vb so that the voltage at the input to the detector 100 is biased to a predetermined voltage. In this way, the AOC circuitry maintains the selected power level within a predetermined range over a wide range temperatures. The drawback of such a system consists in the extra components required for the temperature compensation (not shown in FIG. 1b) and in the inadequate dynamic range.

In U.S. Pat. No. 4,937,842 there is shown a demodulator for detecting digital AM modulation. Negative feedback is provided to a detector via a comparator. The object of this circuit is to keep the detector output at a certain level for a data slicer. In this circuit, the frequency of the feedback loop is limited by a delay circuit to a much lower value than the pulse frequency of the detected data. Severe limiting of the operating frequency of the feedback control is disadvantageous for instance when connecting and disconnecting the transmitter, whereby the rapid variations in the transmitter power require a large bandwidth of the detector.

According to the present invention there is provided control circuitry characterized by a feedback loop for modifying the signal input to the detector depending upon the signal output therefrom.

This has the advantage that a detector is provided with an enlarged dynamic range without the inconveniences of prior art.

An embodiment of the invention will now be described, by way of example only, with reference to the accompanying drawings, of which:

FIG. 1a is a block diagram of a power amplifier control circuit of the prior art and FIG. 1b is a schematic circuit diagram of the detector and compensation circuitry of FIG. 1a;

Figure 1A:
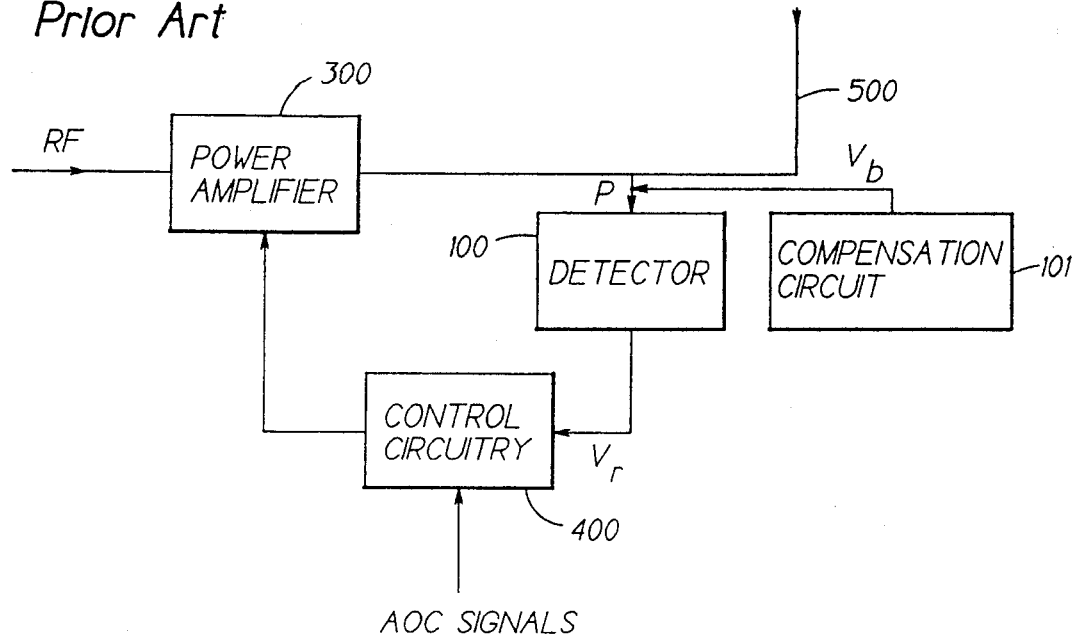
Figure 1B:
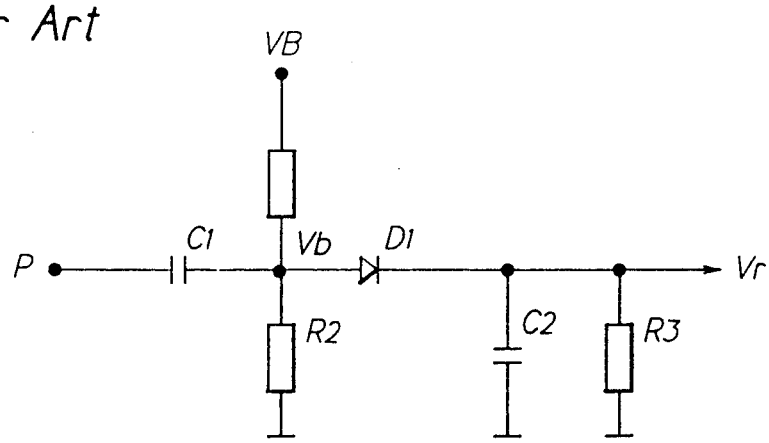
Figure 2:
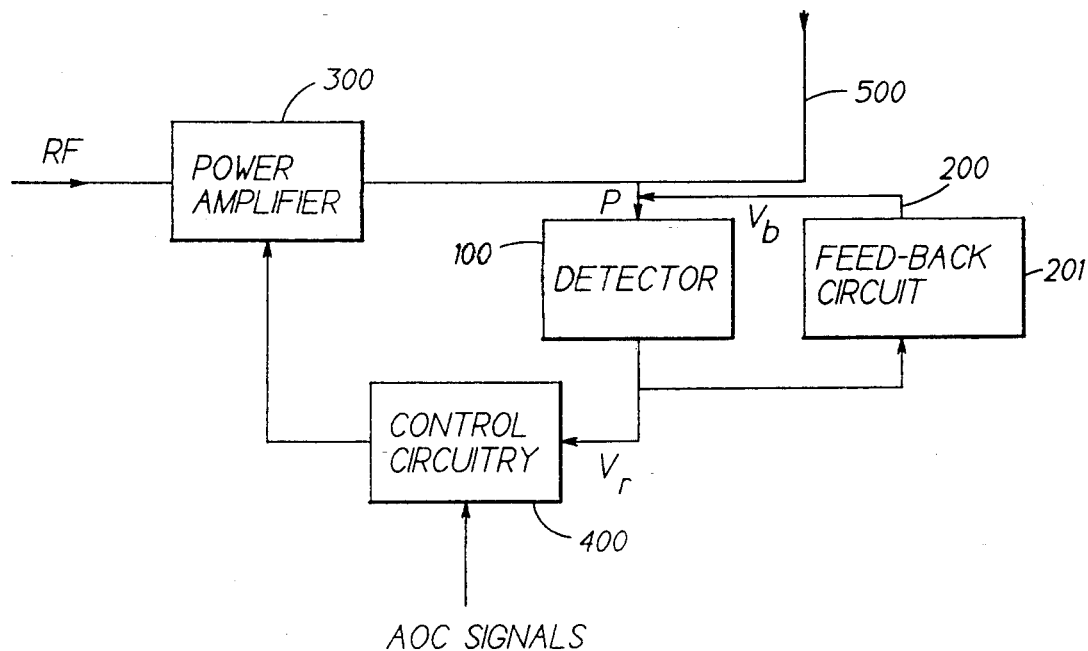
FIG. 2 is a block diagram of power amplifier control circuitry in accordance with the invention.
Figure 3:
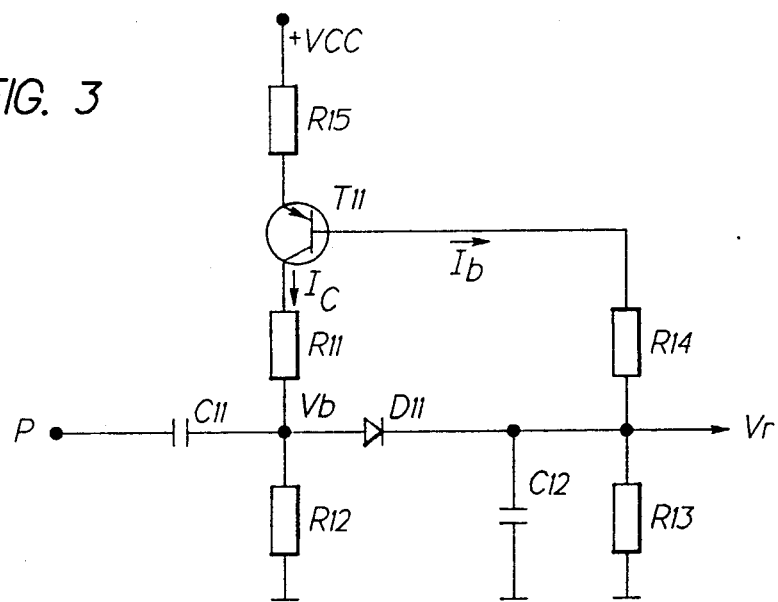
FIG. 3 is a schematic circuit diagram corresponding to the detector and feedback loop of FIG. 2.

Control circuitry in accordance with the invention is illustrated in FIGS. 2 and 3, and is similar to that of the prior art, apart from the fact that there is no temperature compensation, and a feedback loop 200 is provided. In FIG. 3 the components C11, C12, R11, R12 and R13 correspond to the components C1, C2, R1, R2 and R3 of the prior art circuit of FIG. 1b.

The negative feedback loop 200 comprises feedback circuitry 201 which comprises a resistance R14 and a transistor T11. The resistor R14 is coupled to the base of the transistor T11 as shown in FIG. 3. An essentially constant feed voltage +VCC is supplied through a resistor R15 to the emitter of the transistor T11 and the collector of the transistor T11 is coupled via a resistor R11 to the common junction of the capacitor C11, diode D11 and resistor R12. The feed voltage +VCC is suitably chosen for the application. As in the prior art, the detector 100 delivers an output voltage Vr at its output, which is a function of the power level of the input radio frequency signal P from the power amplifier 300. The output voltage Vr is fed back in the negative feedback loop 200 to the transistor base via the resistance R14, and since the feed voltage +VCC remains essentially constant, an increase of the level of the input signal P, and thus the output voltage Vr, will result in an increase of the voltage difference across the resistance R14, so that the base current Ib decreases accordingly. This also brings about a decrease of the collector current Ic of the transistor T11, which again results in a decrease of the bias voltage Vb at the intermediate point of the voltage divider R11/R12. The bias voltage Vb biases the input of the detector 100 so that this decreases the output voltage Vr. Conversely, when the power level of the input signal P decreases, the negative feedback acts in the opposite direction to increase the output voltage Vr. The component values of the circuit may be dimensioned in a manner known to a person skilled in the art so that the desired feedback ratio is obtained.

In accordance with the invention, the bias voltage Vb is adjusted using the output voltage Vr of the detector 100 using negative feedback as shown in FIG. 2. In other words, the detector 100 is biased with the output voltage Vr, which depends on the power of input voltage P rectified by the detector. No temperature compensation is used as in prior art, since the enlarged dynamic range allows the feeding of a sufficient signal level to the detector.

The negative feedback, which reduces the bias voltage Vb of the detector 100, as the level of the high frequency input signal RF increases. The output voltage Vr then increases as a function of the input signal P, however with a slope that is clearly smaller than in known solutions. Thus, the dynamic range of the detector 100 is enlarged. This is illustrated in FIG. 4, which shows a comparison between prior art and the solution of the invention.

Figure 4:
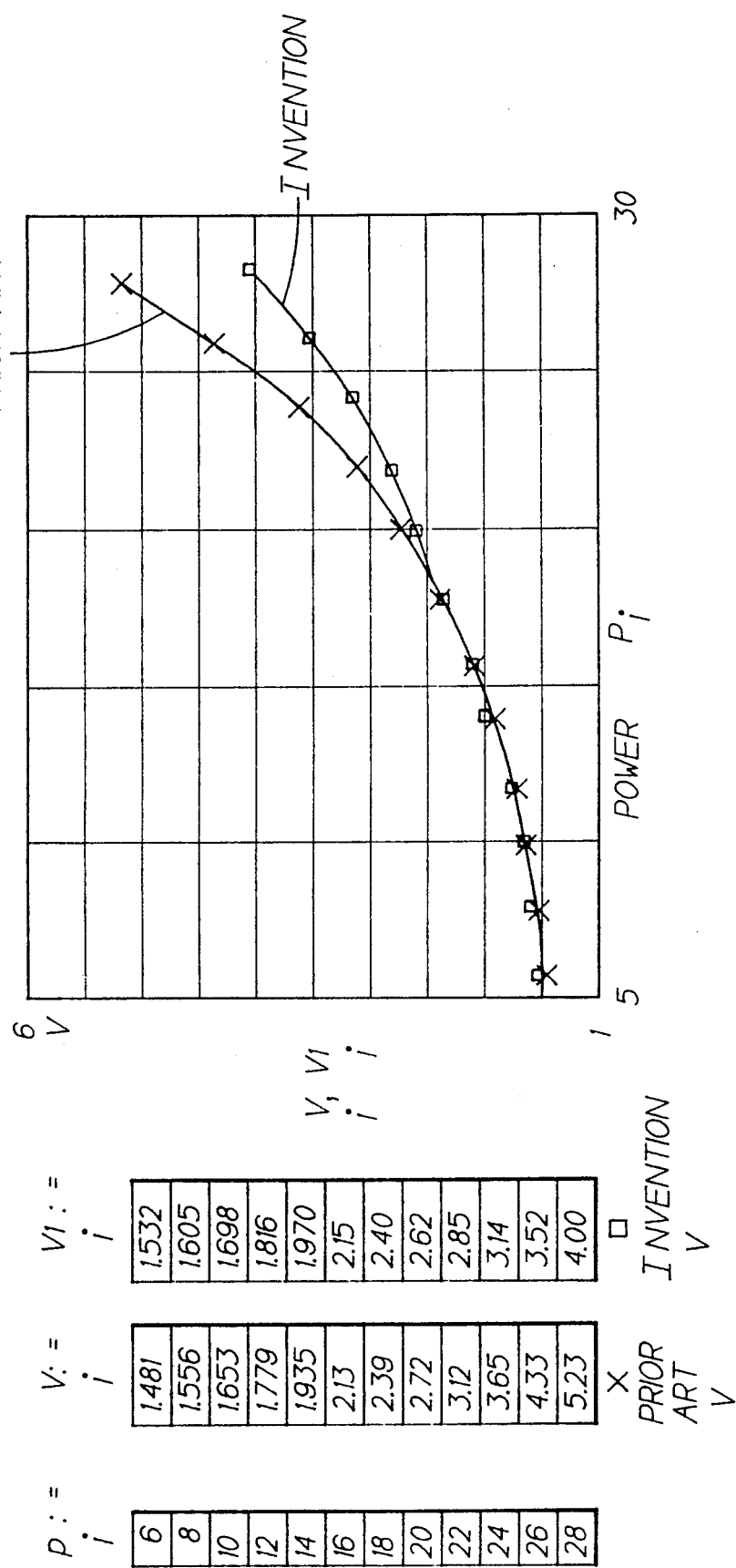
FIG. 4 is a table and graph illustrating the comparison between the prior art and the circuit of FIGS. 2 and 3.

The table in FIG. 4 indicates the output voltage $V_i$ and $Vl_i$ of the detector in the prior art and in a test circuit in accordance with FIGS. 2 and 3, respectively, as a function of the power level $p_i$ of the input signal P. In the test circuit, a feed voltage +VCC of +5 V was used, resistors R11 and R15 had a value of 4.7 kΩ, resistor R13, 33 kΩ, resistor R14, 100 kΩ and capaciters C11 and C12, both had a value of 27 pF. Transistor T11 was a BCW30 and diode D11 BAS70. High frequency detectors connected to a directional coupler coupled to the output of the power amplifier 300 are used for measuring the output voltages $v_i$, $vl_i$. The output voltages $v_i$ and $vl_i$ correspond to the output voltage Vr in FIG. 1, FIG. 2 and FIG. 3, respectively. The output voltages $v_i$, $vl_i$ are given in Volts and the power level $P_i$ is in dBm. The index i denotes the various measuring events, i.e. the power levels supplied to the detector, i=1 ... 12. The measurements were carried out on the power levels 6-28 dBm, whereby the output voltage $v_i$ in the known detector varied accordingly in the range of 1.481-5.23 V. With the circuit of FIG. 3, the output voltage $vl_i$ varied accordingly in the range of 1.532-4.00 V. The same phenomenon is indicated as a curve on the righthand side of FIG. 4, where the power level $p_i$ of the input signal P of the detector 100 constitutes the horizontal axis and the output voltages $v_i$, $vl_i$ has been given on the vertical axis. The output voltages $v_i$ are represented by the curve PRIOR ART and the output voltages $vl_i$ by the curve INVENTION. By comparing the curves, one notes that with the circuit of FIG. 3, the power level of the input voltage is, initially, slightly above that of the prior art to some extent, but the main thing is that the invention yields of the curve with a substantially smaller slope than that of the curve PRIOR ART. This means that the detector has larger dynamic range. Supposing that the limit set by the feed voltage +VCC of the device on the level of the output signal is 4 V, the detector operating according to curve PRIOR ART would be usable only on the input levels 5-25 dBm. The circuit of FIG. 3 would operate on the input levels 5-28 dBm.

It will be evident, from the foregoing description, to a person skilled in the art, that various modifications are possible within the scope of the present invention. For example, a feedback loop in accordance with the invention could be provided for other similar radio frequency detectors used in other applications to provide a stable output and a wide dynamic range.

We claim:

1. Control circuitry for maintaining the magnitude of an output radio frequency signal, from an output terminal of a radio frequency signal amplifier, at a predetermined level, the control circuitry comprising a power level detector including an input terminal for receiving an input signal indicative of the power level of the said output radio frequency signal from the said amplifier output terminal and an output terminal for delivering an output signal dependent upon the said input signal to said detector wherein the said output signal from said detector is used to control the gain of the said amplifier, characterized by a feedback loop connected between the said input and output terminals of said detector for modifying the said input signal to the said detector depending upon the said output signal therefrom.

2. Control circuitry according to claim 1 wherein the feedback loop is a negative feedback loop supplying a biasing signal to the said input terminal of the said detector for modifying the said input signal whereby an increase in the said output signal from the said detector results in a decrease in the magnitude of the said biasing signal and a decrease in the said output signal from the said detector results in an increase in the magnitude of the said biasing signal.

3. Control circuitry according to claim 2 wherein the feedback loop comprises a transistor having emitter, collector and base electrodes and emitter, collector and base currents, whose said base electrode is coupled to the output of the said detector and whose said collector electrode is coupled to the input of the said detector such that the increase or decrease in the magnitude of the said output signal from the said detector results in a decrease or increase in the said base current of the transistor respectively, a corresponding respective decrease or increase in the said transistor collector current and hence in the magnitude of the said biasing signal.

4. A circuit arrangement for biasing a high frequency detector, the said detector having an input terminal for receiving a radio frequency input signal and an output terminal for delivering an output signal dependent upon the said radio frequency input signal, characterized by a negative feedback loop supplying a biasing signal to the said input terminal of the detector for modifying the input signal whereby an increase in the output signal from the detector results in an increase in the magnitude of the biasing signal; wherein the said negative feedback loop includes a transistor having emitter, collector and base electrodes with emitter, collector and base current, said base electrode coupled to the said output terminal of the detector and said collector electrode coupled to the said input terminal of the detector such that the increase or decrease in the magnitude of the said output signal from the detector results in a decrease or increase in the said base current of the transistor respectively, and a corresponding respective decrease or increase in the said transistor collector current and hence in the magnitude of the said biasing signal.

* * * * *